(12) United States Patent
Takahashi (10) Patent No.: US 6,621,558 B1
(45) Date of Patent: Sep. 16, 2003

(54) EXPOSURE APPARATUS AND DEVICE MANUFACTURING METHOD USING THE SAME

(75) Inventor: Kazuhiro Takahashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/711,068

(22) Filed: Nov. 14, 2000

Related U.S. Application Data (63) Continuation of application No. 08/944,987, filed on Oct. 7, 1997, now Pat. No. 6,163,365.

(30) Foreign Application Priority Data

Oct. 11, 1996 (JP) ............................................. 8-269973

(51) Int. Cl.⁷ .......................... G03B 27/72; G03B 27/42
(52) U.S. Cl. .............................. 355/69; 355/53; 355/71
(58) Field of Search ..................... 355/53, 55, 67–71, 355/77; 356/399–401; 250/492.2, 492.22

(56) References Cited

U.S. PATENT DOCUMENTS

| | | | |
|---|---|---|---|
| 4,583,840 A | 4/1986 | Yabu et al. ..................... 355/30 |
| 4,701,606 A | 10/1987 | Tanimoto et al. ........... 250/201 |
| 5,430,303 A | 7/1995 | Matsumoto et al. ..... 250/492.2 |
| 5,508,528 A | 4/1996 | Mulkens et al. .......... 250/492.1 |
| 5,526,093 A | 6/1996 | Takahashi ..................... 355/53 |
| 5,591,958 A | 1/1997 | Nishi ........................... 250/205 |
| 5,602,683 A | 2/1997 | Straaijer et al. ............. 359/811 |
| 5,636,000 A | 6/1997 | Ushida et al. ................. 355/30 |
| 5,659,383 A | 8/1997 | Ozawa .......................... 355/53 |
| 5,696,623 A | 12/1997 | Fujie et al. .................. 359/350 |
| 5,699,148 A | 12/1997 | Shiozawa ..................... 355/71 |
| 5,710,620 A | 1/1998 | Taniguchi ..................... 355/53 |
| 5,721,608 A | 2/1998 | Taniguchi ..................... 355/53 |
| 5,883,701 A * | 3/1999 | Hasegawa et al. ............ 355/53 |
| 5,898,477 A * | 4/1999 | Yoshimura et al. ........... 355/53 |
| 6,154,270 A * | 11/2000 | Ozawa .......................... 355/53 |
| 6,222,615 B1 * | 4/2001 | Suzuki ......................... 355/68 |

FOREIGN PATENT DOCUMENTS

| | | |
|---|---|---|
| BE | 1007851 | 11/1995 |
| BE | 1007907 | 11/1995 |
| EP | 0 689 099 | 12/1995 |
| FR | 2708757 | 2/1995 |
| GB | 2131187 | 6/1984 |
| JP | 4-42521 | 2/1992 |
| JP | 5-47639 | 2/1993 |
| JP | 5-251310 | 9/1993 |
| JP | 6-204113 | 7/1994 |
| JP | 7-20828 | 1/1995 |
| JP | 7-307281 | 11/1995 |
| JP | 8-160340 | 6/1996 |
| JP | 6-77107 | 3/1997 |

* cited by examiner

*Primary Examiner*—Henry Hung Nguyen
(74) *Attorney, Agent, or Firm*—Fitzpatrick, Cella, Harper & Scinto (57) ABSTRACT

An exposure apparatus for transferring a pattern onto a surface of the substrate by exposure includes a detector for indirectly detecting a light quantity on the substrate surface on the basis of an extracted portion of exposure light and a transmission factor stabilizer for projecting exposure light to an optical element disposed between the substrate surface and a position where the portion of the exposure light is extracted during a non-exposure period in which an actual exposure process is not performed, so as to stabilize the transmission factor of the optical element.

21 Claims, 6 Drawing Sheets

EXPOSURE APPARATUS AND DEVICE MANUFACTURING METHOD USING THE SAME

This application is a continuation of application Ser. No. 08/944,987, filed Oct. 7, 1997 now U.S Pat. No. 6,163,365.

FIELD OF THE INVENTION AND RELATED ART

This invention relates to an exposure apparatus and a device manufacturing method. More particularly, the invention is concerned with an exposure apparatus for use in an exposure process for the manufacture of devices such as a semiconductor devices (e.g., ICs or LSIs), image pickup devices (e.g., CCDs), display devices (e.g., liquid crystal panels) or sensors (e.g., magnetic heads), for example. In another aspect, the invention is concerned with a device manufacturing method for manufacturing devices such as described above.

An optical element such as a transparent plate, a lens or a prism used in a projection optical system or an illumination optical system of a projection exposure apparatus is formed on its bottom surface with an anti-reflection film (optical thin film). The provision of such an anti-reflection film is to efficiently direct light, from a light source, to a photosensitive substrate and also to prevent a flare or a ghost from impinging on the photosensitive substrate. Since a light source of a projection optical system produces strong ultraviolet rays, intensive ultraviolet light is projected on the surface of an optical element of an illumination optical system or of a projection optical system. Particularly, in a case wherein the light source comprises an excimer laser which emits pulse light in the ultraviolet region, the energy of ultraviolet light per unit time is very large. As a result, the spectral reflectivity characteristic of an anti-reflection film or the absorptivity at various surfaces may slightly change, to cause a change in spectral transmissivity. Generally, an illumination optical system and a projection optical system include optical elements having surfaces of a number of a few tens in total. Thus, even if the spectral transmissivity change per one surface is small, it may cause a large spectral transmissivity change in total.

Spectral reflectivity of an anti-reflection film changed by irradiation of ultraviolet rays may change, if irradiation of ultraviolet light is stopped, to be restored to its original spectral reflectivity characteristic. Thus, the transmissivity of the illumination optical system or projection optical system changes with the state of operation of the exposure apparatus. Such a phenomenon may attribute to water content or organic materials within the film from being disengaged by intensive ultraviolet rays entered into the film while, on the other hand, in a state in which no ultraviolet light is projected, the water content or organic materials within the environment being absorbed by the film.

Generally, the amount of exposure to be supplied to a photosensitive substrate may be controlled by receiving a portion of ultraviolet light by the use of a photodetector disposed in the illumination optical system and by detecting the light quantity upon the photosensitive substrate on the basis of the received light quantity and of the ratio between the received light quantity and the exposure amount, which may be determined beforehand. Thus, if the transmissivity of an (illumination) optical system after such a photodetector and of the projection optical system varies due to the phenomenon described above, the ratio between the light quantity as projected on the photodetector and the light quantity supplied onto the photosensitive substrate may change, causing an error in the detected value of the exposure amount. As a result, the photosensitive substrate cannot be exposed with a correct exposure amount.

Additionally, there may be a case wherein a change in spectral reflectivity (spectral transmissivity) of an anti-reflection film causes a change in an illuminance distribution upon a photosensitive substrate.

SUMMARY OF THE INVENTION

It is an object of the present invention to provide an exposure apparatus and a device manufacturing method, by which a substrate can be exposed with a correct exposure amount.

In accordance with a first aspect of the present invention, there is provided an exposure apparatus for illuminating a mask with an illumination optical system to expose a substrate in accordance with a pattern of the mask, said apparatus comprising: transmissivity maintaining means for maintaining, substantially constant, a transmissivity of a portion of or the whole of said illumination optical system.

In accordance with a second aspect of the present invention, there is provided an exposure apparatus for illuminating a mask with an illumination optical system and for projecting a pattern of the mask onto a substrate through a projection optical system, said apparatus comprising: transmissivity maintaining means for maintaining, substantially constant, a transmissivity of a portion of or the whole of a system provided by said illumination optical system and said projection optical system.

In accordance with a third aspect of the present invention, there is provided an exposure apparatus for illuminating a mask with light from a light source and through an illumination optical system, and for projecting a pattern of the mask onto a substrate through a projection optical system, said apparatus comprising: transmissivity maintaining means for projecting light, from the light source, to said illumination optical system and said projection optical system so as to maintain, substantially constant, a transmissivity of said illumination optical system and said projection optical system. The light projection by said transmissivity maintaining means may be performed, basically, before practically exposing the substrate.

In the first to third aspects of the present invention, said illumination optical system may include optical elements having anti-reflection films formed on their light entrance and exit surfaces.

The illumination optical system may include a reflection mirror having an intensified reflection film.

The illumination optical system and the projection optical system may include optical elements having anti-reflection films formed on their light entrance and exit surfaces, wherein said optical elements may include lens elements.

In the first to third aspects of the present invention, said illumination optical system may include light dividing means for dividing light from a light source, and said apparatus may further comprise photoelectric converting means for receiving a portion of light from said light source as provided by said light dividing means, and exposure amount control means for detecting and controlling the amount of exposure of the substrate on the basis of an output of said photoelectric converting means.

The transmissivity maintaining means may maintain, substantially constant, the transmissivity of an optical system between said light dividing means and the substrate.

The apparatus may further comprise transmissivity measuring means for measuring transmissivity of an optical system between said light dividing means and the substrate.

The transmissivity measuring means may include said photoelectric converting means as well as second photoelectric converting means at least having a light receiving portion provided on substrate holding means, for holding the substrate and being movable, wherein said photoelectric converting means and said second photoelectric converting means may operate to perform photoelectric conversion of lights impinging on them while said second photoelectric converting means may be disposed opposed to a light exit surface of an optical system between said light dividing means and the substrate, wherein a ratio of outputs of said photoelectric converting means and said second photoelectric converting means may be calculated, and wherein the transmissivity may be determined on the basis of the calculated output ratio.

In the first to third aspects of the present invention, said transmissivity maintaining means may maintain, substantively constant, the transmissivity of an optical system between said light dividing means and the substrate, by projecting light from the light source to the optical system between said light dividing means and the substrate.

While predicting the transmissivity of an optical system between said light dividing means and the substrate on the basis of an output of said photoelectric converting means, light from the light source may be projected to the optical system between said light dividing means and the. substrate, separately from a practical exposure operation, to thereby set the transmissivity between said light dividing means and the substrate at a desired value.

The amount of change of transmissivity of an optical system between said light dividing means and the substrate may be predicted on the basis of an output of said photoelectric converting means and of time information, wherein, when the amount of change of transmissivity exceeds a predetermined value, a predetermined quantity of light from the light source may be projected to the optical system between said light dividing means and the substrate, separately from a practical exposure operation, to thereby set the transmissivity of the optical system between said light dividing means and the substrate to a desired value.

A predetermined quantity of light from the light source may be projected, with a certain periodicity, to an optical system between said light dividing means and the substrate, to thereby maintain, substantially constant, the transmissivity of the optical system between said light dividing means and the substrate, wherein said predetermined periodicity may be "once at a predetermined time per one day (twenty-four hours)" or "once at a predetermined time per two days (forty-eight hours)".

The transmissivity measuring means may measure the transmissivity of an optical system between said light dividing means and the substrate, wherein, when the measured value is out of a predetermined range, a predetermined quantity of light from the light source may be projected to the optical system between said light dividing means and the substrate, separately from a practical exposure operation, to thereby set the transmissivity of the optical system between said light dividing means and the substrate to a desired value.

In these cases, usually, before a practical (initial) exposure operation, a predetermined quantity of light from the light source may be projected to an optical system between said light dividing means and the substrate to thereby set the transmissivity of the optical system between said light dividing means and the substrate to a desired value.

The optical system between said light dividing means and the substrate may include a projection optical system for projecting a pattern of the mask onto the substrate, wherein said apparatus may further comprise correcting means for projecting light from the light source to an optical system between said light dividing means and the substrate, to thereby compensate for a change in optical characteristic produced in said projection optical system.

The correcting means may include predicting means for predicting an amount of change of the optical characteristic at a predetermined time, and adjusting means for adjusting said apparatus in accordance with the predicted amount of change.

The optical characteristic may include a projection magnification of said projection optical system, wherein said adjusting means may include at least one of (i) moving means for moving one of a lens element of said projection optical system and the mask in an optical axis direction of said projection optical system, (ii) pressure changing means for changing a pressure of air between lenses of said projection optical system, and (iii) wavelength changing means for changing a wavelength of light from the light source.

The optical characteristic may include an imaging position of the mask pattern through said projection optical system, wherein said adjusting means may include at least one of (i) moving means for moving the substrate in an optical axis direction of said projection optical system, (ii) pressure changing means for changing a pressure of air between lenses of said projection optical system, and (iii) wavelength changing means for changing a wavelength of light from the light source.

In the first to third aspects of the present invention, said light apparatus may include an excimer laser as a light source for the exposure operation, wherein said excimer laser may comprise one of a KrF excimer laser and an ArF excimer laser.

The illumination optical system may serve to define a slit-like illumination region of a width smaller than the width of the whole pattern of the mask to be transferred, and wherein the mask and the substrate may be scanned relative to said illumination optical system in a direction perpendicular to the lengthwise direction of the slit-like illumination region by which the whole mask pattern may be transferred to the substrate.

The illumination optical system may serve to define an illumination region of the same size as the whole pattern of the mask to the be transferred.

In accordance with a further aspect of the present invention, there is provided a device manufacturing method which includes a process of transferring a device pattern onto a substrate by use of an exposure apparatus such as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
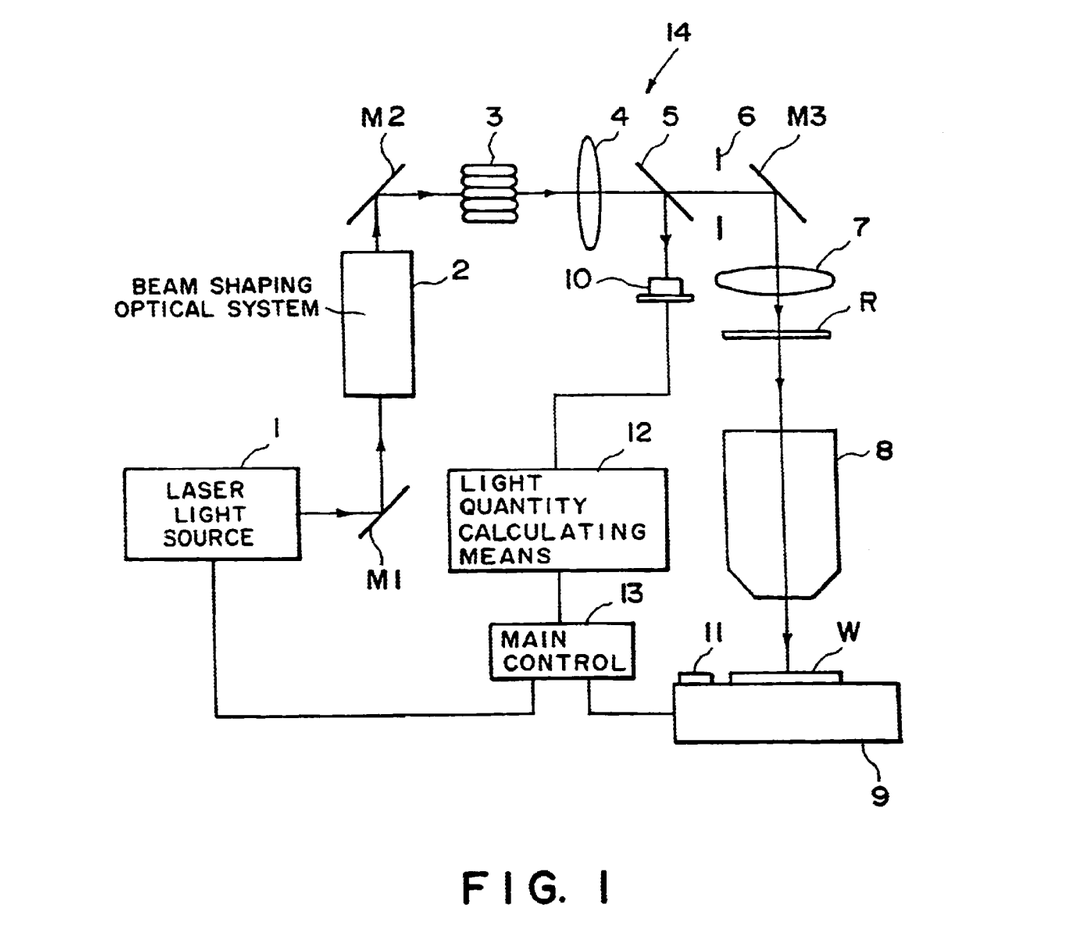
FIG. 1 is a schematic view of an exposure apparatus according to an embodiment of the present invention.

FIG. 1 is a schematic view of the structure of an exposure apparatus according to an embodiment of the present invention. Denoted at 1 is an excimer laser which is a light source, and denoted at 2 is a beam shaping and incoherency transformation optical system for shaping laser light from the laser light source 1 and for transforming it into incoherent light. Denoted at 3 is an optical integrator, which comprises a fly's eye lens, for example, which serves to define secondary light sources. Denoted at 4 is a condenser lens for illuminating a portion of a masking blade 6 about the opening thereof, with light from the optical integrator 3. Denoted at 5 is a beam splitter (or half mirror) for extracting a portion of the light from the optical integrator 3. The extracted light is directed to a photodetector 10 (hereinafter "detector 10"). On the basis of a photoelectric conversion output of the detector 10, the amount of exposure of a photosensitive substrate (wafer) is monitored.

The masking blade 6 comprises four light blocking plates which are movable independently of each other. The opening of the masking blade 6 is projected by an imaging lens 7 onto a reticle (mask) R, whereby only a predetermined region on the reticle R is illuminated. Denoted at M1, M2 and M3 are deflection mirrors for deflecting the light path. These mirrors have intensified reflection films formed on their reflection surfaces. A circuit pattern formed on the reticle R is projected onto a photosensitive substrate W through a projection optical system 8. Denoted at 9 is an X-Y stage for holding the photosensitive substrate thereon and for moving it stepwise in the X and Y directions. Mounted on the X-Y stage 9 is an illuminometer 11 for measuring the illuminance upon a plane at the same level as the surface of the photosensitive substrate W during the exposure. Denoted at 12 is a calculating means for calculating an integrated exposure amount, from the light quantity as measured by the detector 10. Denoted at 13 is a main control for the projection exposure apparatus.

Figure 2:
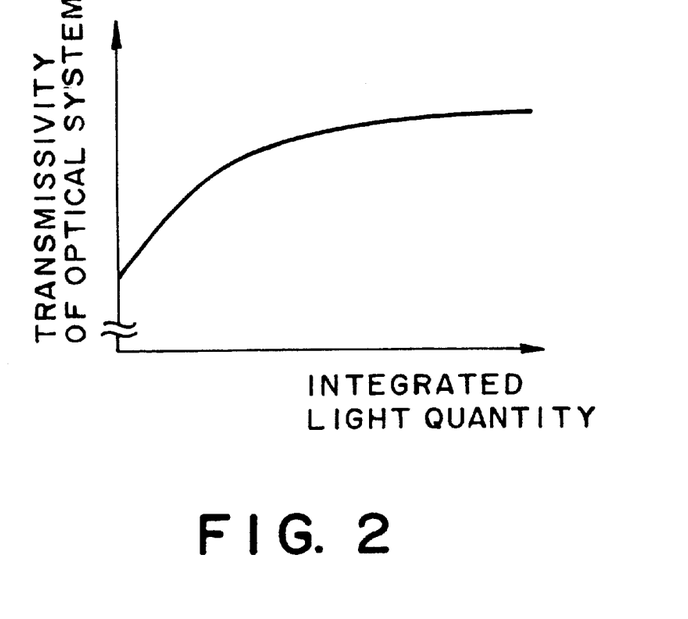
FIG. 2 is a graph for explaining the relation between an integrated light quantity and transmissivity.

FIG. 2 is a graph for explaining a variation of transmissivity of an optical system, comprising the imaging lens 7 and the projection optical system 8, to changes in integrated (irradiation) light quantity, in response to irradiation with light from the laser 1. The graph shows a result of measurement having been made beforehand. For the measurement, the illuminometer 11 is moved by the X-Y stage 9 into the irradiation region under the projection optical system 8, and the output of the detector 10 per unit time and the output of the illuminometer 11 per unit time are detected, wherein, with respect to an integrated value as measured by the detector 10, the ratio of these outputs is detected. As seen in FIG. 2, the transmissivity of the system increases with the irradiation, and it is saturated with an integrated light quantity higher than a certain level.

Figure 3:
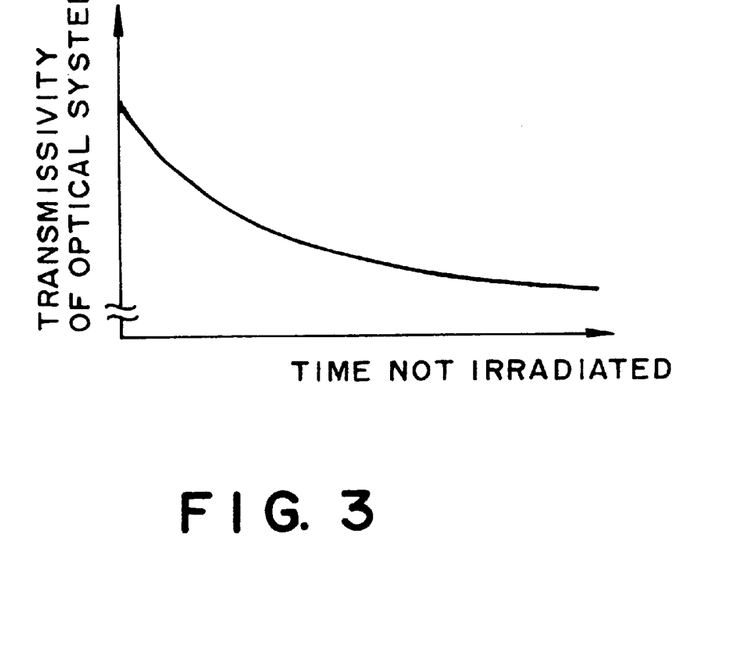
FIG. 3 is a graph for explaining the relation between the time without light irradiation and the transmissivity.

FIG. 3 is a graph for explaining a variation, with respect to time, of the transmissivity of the system comprising the imaging lens 7 and the projection optical system 8, in a state wherein the apparatus is left without being irradiated with light. For the measurement, the illuminometer 11 is moved to a position similar to that in the FIG. 2 example, and the transmissivity is measured by use of the outputs of the detectors 10 and 11 while lighting the light source 1 periodically only for a certain time. It is seen from FIG. 3 that, if the apparatus is left without being irradiated with light, the transmissivity of the system gradually decreases with an elapse of time, and it becomes constant at a certain level.

On the basis of the results as shown in FIGS. 2 and 3, the main control 13 of the projection exposure apparatus of the FIG. 1 embodiment operates to predict, when the apparatus is under operation, the value of transmissivity of the system comprising the condensing lens 7 and the projection optical system 8, in accordance with the integrated light quantity per unit time as monitored through the detector 10 and with values of the aperture area of the masking blade 6 and the transmissivity of the reticle R. If the apparatus is left without light irradiation, the main control predicts the transmissivity of the system, comprising the imaging lens 7 and the projection optical system 8, from the transmissivity just before the apparatus is left and from the time in which the apparatus has been left. If, during non-operation, the value of transmissivity of the system comprising the imaging lens 7 and the projection optical system 8 becomes lower than a predetermined (threshold) value, the main control 13 applies a signal to the laser 1, separately from a practical exposure operation, to cause the laser 1 to emit light so that the light is projected to the system, until the transmissivity of the system comprising the imaging lens 7 and the projection optical system 8 increases to the predetermined level.

Here, if the value of the integrated light quantity as projected to the system comprising the imaging lens 7 and the projection optical system 8, being calculated by the calculating means 12 on the basis of the output of the detector 10, reaches a desired level, the main control 13 stops light emission of the laser 1.

Similarly, before a start of operation of the exposure apparatus, the laser 1 is energized to emit light to irradiate the system with the light, so that the value of transmissivity of the system increases (or decreases) to a predetermined level. This applies similarly to other embodiments, to be described below.

In place of determining the integrated light quantity by monitoring the actual light quantity by use of the detector 10, it may be controlled in accordance with the number of emitted pulses or the time of irradiation wherein the light source comprises a pulse laser, as in the present embodiment. When the light source 1 comprises a lamp, a shutter (not shown) may be opened for a predetermined time.

The excimer laser 1 may comprise a KrF excimer laser or an ArF excimer laser, wherein the half width of a spectral line is band-narrowed to 3 pm or less. While the projection optical system 8 of this embodiment comprises a lens system constituted only by $SiO_2$, a lens system comprising a combination of $SiO_2$ lenses and $CaF_2$ lenses may be used. Alternatively, the projection optical system 8 may comprise catadioptics having a lens and a concave mirror. Further, for an improved resolving power and enhanced transmissivity, the projection optical system may include an aspherical surface lens or a diffractive optical element such as binary optics or a kinoform, for example. This applies to other embodiments to be described later.

The beam shaping and incoherency transformation optical system 2 has a known structure such as disclosed in Japanese Published Laid-Open Patent Application No. 47639/1993, for example, and a description of details of it will be omitted here.

In FIG. 2, the saturated transmissivity is at a level higher, by a few percent, than the transmissivity before a start of light irradiation of the optical system 7 and 8, and it is seen that it took several tens of hours until the saturation.

In this embodiment, for a correct exposure amount control, light is projected appropriately to the optical system 7 and 8 from the exposure light source, so that the transmissivity of the optical system 7 and 8 is maintained in a certain range of ±1% about the value of transmissivity as saturated. Also, by doing such transmissivity control, non-uniformness of illuminance upon the reticle R or photosensitive substrate W can be kept small. This applies to other embodiments to be described later. The range described above may of course be changed as desired or in accordance with the type of the apparatus.

While the embodiment has been described with reference to an example wherein the transmissivity of the system comprising the imaging optical system 7 and the projection optical system 8 increases in response to light irradiation and it decreases in response to stopping of the light irradiation, there may be an inverse phenomenon, depending on the characteristics of an anti-reflection film formed on the light entrance or exit surfaces of optical elements, such as the lens, prism or plate, constituting the illumination optical system 14 or projection optical system 8. The present invention is also applicable to such cases. The anti-reflection film of this embodiment comprises alternate layers of $Al_2O_3$ and $SiO_2$, while the intensified reflection film formed on each mirror comprises alternate layers of $HaO_2$ and $SiO_2$.

The time in which a variation of transmissivity of the optical system 7 and 8, as they are left without being irradiated, exceeds the above-described predetermined range can be determined from the results shown in FIGS. 2 and 3. Thus, the main control 13 may energize the laser 1 during an elapse of this time to emit light until the integrated light quantity at the output of the detector 10 reaches a predetermined level, such that the transmissivity of the optical system 7 and 8 may be maintained within that range.

In a case wherein the apparatus is continuously held out of operation for any reason and the transmissivity goes beyond the predetermined range, an integrated light quantity which can meet such an occasion may be determined beforehand and the main control 13 may operate to light the laser 1 automatically at the moment of which the apparatus is restored and before a start of an actual exposure operation, so that light of a necessary quantity may be applied to the optical system 7 and 8. The integrated light quantity may be controlled on the basis of the number of total pulses projected.

In this embodiment, separately from the actual exposure operation, the laser 1 is excited to emit light at a predetermined time moment, once per day or once per two days, for example.

In the exposure apparatus of FIG. 1, the illuminometer 11 is moved by the X-Y stage 9 into the irradiation region of the projection optical system 8, and while engaging the laser 1 to emit light, the transmissivity of the optical system 7 and 8 is measured on the basis of the output ratio between the detector 10 and illuminometer 11. If the result of the measured transmissivity is out of the predetermined range as described, the light source 1 is lighted in response to a signal from the main control 13. Even during the light being emitted, the output ratio between the detector 10 and the illuminometer 11 may be measured to determine the transmissivity of the optical system 7 and 8, so that the light emission of the laser 1 may be stopped by the main control 13 when the transmissivity of the optical system 7 and 8 reaches a predetermined level within the predetermined range.

Figure 4:
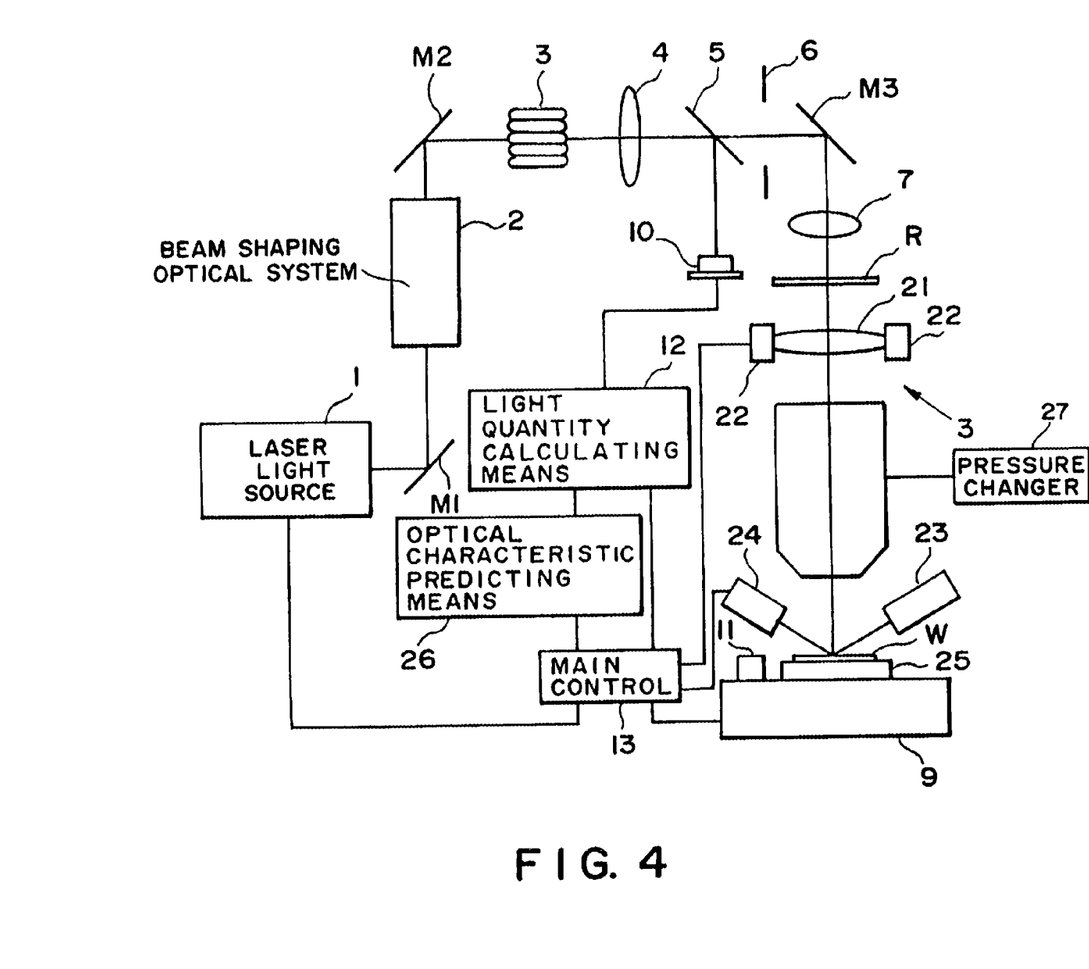
FIG. 4 is a schematic view of an exposure apparatus according to another embodiment of the present invention.

FIG. 4 is a schematic view of the structure of an exposure apparatus according to another embodiment of the present invention. In FIG. 4, reference numerals similar to those of FIG. 1 are assigned to corresponding elements, and a duplicate explanation of them will be omitted, for simplicity.

Denoted at 21 is a field lens which is a component of the projection optical system. It is held by a field lens driving mechanism 22, and it can be moved in response to a signal from the main control 13, in the optical axis direction of the optical system 8, to correct or compensate for a change in projection magnification of the projection optical system 8, or to set it at a desired value. Denoted at 23 and 24 is an autofocus detection system for detecting the height (level) of the surface of a photosensitive substrate W with respect to the optical axis direction. It comprises an illumination system 23 for illuminating the photosensitive substrate W and a light receiving system 24 for receiving light reflected by the surface of the photosensitive substrate W. The main control 13 detects the position of the photosensitive substrate W in accordance with the position of light reception and actuates a Z stage, mounted on the X-Y stage 9, in accordance with the position detection so that the surface of the photosensitive substrate W is brought into registration with the best focus plane of the projection optical system 8. Denoted at 26 is optical characteristics predicting means for calculating the amount of change of optical characteristics of the projection optical system, such as focus position or projection magnification, for example.

When light from the laser 1 enters the projection optical system 8, lenses of the projection optical system 8 absorb a portion of the light and their temperature rises slightly. The optical characteristic predicting means 26 predicts a change in optical characteristic of the projection optical system 8, from the result of measurement of the light quantity by the detector 10, the aperture area of the masking blade 6 and the value of transmissivity of the reticle R.

Figure 5:
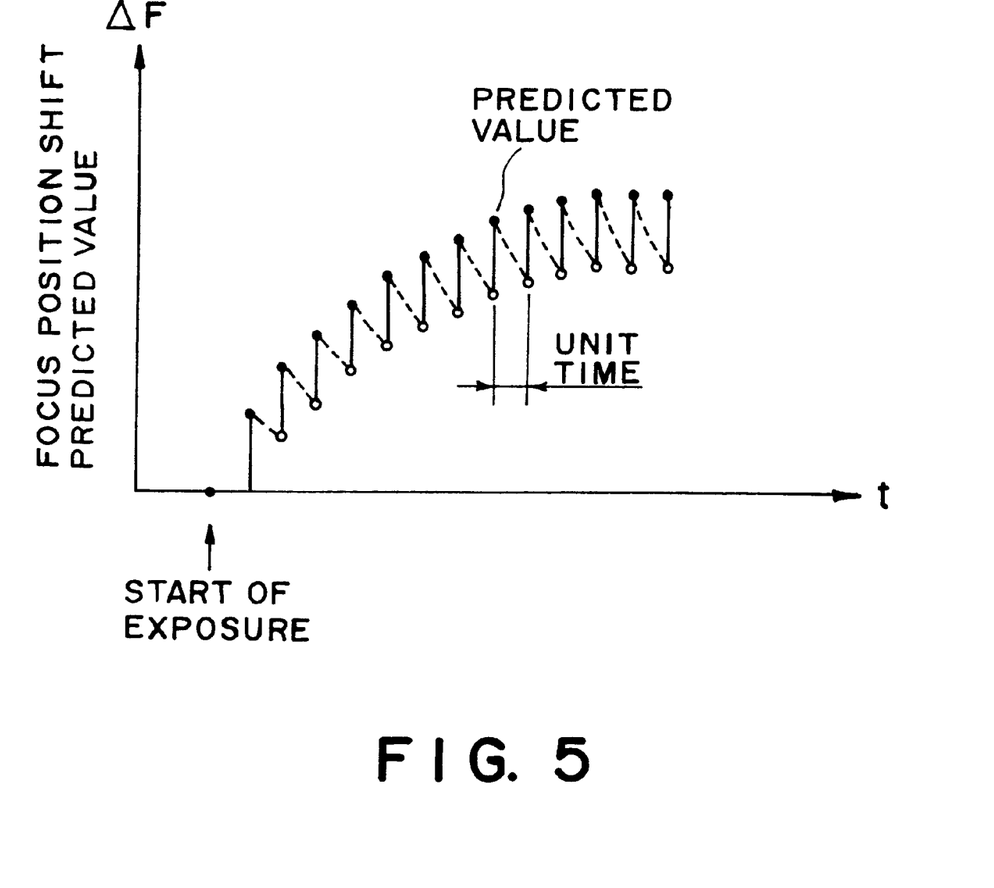
FIG. 5 is a graph for explaining a variation of focus position of a projection lens system.

FIG. 5 shows predicted values of a change in focus position as the light enters the projection optical system 8. While the illustrated graph concerns the focus position, changes of projection magnification can be predicted in a similar manner.

On the basis of a prediction by the optical characteristic predicting means 26, the main control 13 supplies a driving signal to the field lens driving mechanism 22, with regard to the magnification, to move the field lens at a predetermined position along the optical axis direction, to thereby compensate for the change of projection magnification of the projection optical system 8. With regard to changes in focus position, the main control 13 operates to move the Z stage 25 in the optical axis direction so that the surface of the photosensitive substrate W is brought into alignment with the focus plane of the projection optical system 8, whose position is variable with irradiation with light, while taking into account a predetermined offset to be added to the height information as measured by the light receiving system 24.

The main control 13 predicts the amount of change of optical characteristic of the projection optical system 8 in association with the optical characteristic predicting means 26, and, in accordance with the result of it, the main control supplies an offset as described, corresponding to the predicted value, to the autofocusing system including the sensor (23 and 24). The main control 13 takes thereinto parameters for calculation of the amount of change, wherein the parameters may include the time period t of irradiation of the optical system 7 and 8 with light, the time t' between irradiation periods, the output of the detector 10, the aperture area of the masking blade 6, the quantity QD of light projected to the optical system 8 as can be calculated from the transmissivity of the reticle R, or a coefficient Da peculiar to the reticle R used.

From these parameters and coefficients originally set in the apparatus, the optical characteristic predicting means 26 predicts changes of optical characteristics during repetition of light projection. A calculation therefor will be explained with reference to an example of a change ΔF of the focus position of the projection optical system 8. This calculation uses first-order equations.

$$\Delta F = \Delta F1 + \Delta F2$$

$$\Delta F1 = SF \cdot QD \cdot Da \cdot DT$$

$$\Delta F2 = \Delta F' \cdot \exp(-k_F \cdot t)$$

wherein SF is a proportional constant, QD is a parameter corresponding to the total quantity of light passing through the circuit pattern, Da is a correction coefficient peculiar to the reticle R used, DT is the proportion of the time period in which, during a unit time to be used for calculation, the light projection has been made, and $k_F$ is a parameter which represents thermal conduction of the optical elements of the projection optical system 4. ΔF' is the amount of change of the focus position of the projection optical system 8, as calculated in the preceding unit time. ΔF1 is the amount of change of focus position per unit time, due to heat absorption of the projection optical system 8, and ΔF2 is the amount of change of the focus plane of the projection optical system per unit time, due to heat discharge therefrom. ΔF2 may be expressed in terms of linear coupling of plural terms.

A calculation by the optical characteristic predicting means 26 is made repeatedly at unit time periods, and the amount of change of the focus position of the projection optical system 8 detected by calculation varies along a curve having an envelope represented by a function of a natural logarithm such as shown in FIG. 5.

Correction of the projection magnification of the projection optical system 8 may be provided, other than by the driving means 22 for moving the field lens 21. For example, at least one of (i) driving means for moving the reticle R in the optical axis direction, in a case wherein the projection optical system 8 is not telecentric on the light entrance side, (ii) pressure changing means for changing the pressure of a space (closed space) between a pair of lenses of the projection optical system 8, and (iii) wavelength changing means for changing the emission wavelength of the excimer laser (light source) 1, may be used.

Correction of the imaging position of the pattern of the reticle R through the projection optical system 8, that is, of the focus position, may be provided, other than by the moving means for moving the photosensitive substrate W in the optical axis direction of the projection optical system 8. For example, the correction may be performed by using at least one of (i) pressure changing means 27 for changing the pressure of a spaced (closed space) between a pair of lenses of the projection optical system 8, and (ii) wavelength changing means (provided by main control 13) for changing the emission wavelength of the excimer laser 1.

While the embodiments of FIGS. 1–5 have been described with reference to an example of a projection type exposure apparatus, the present invention is applicable also to any exposure apparatus, such as a proximity type or contact type exposure apparatus, including lenses with light entrance and exit surfaces formed with anti-reflection films wherein similar problems are involved.

Further, while in the embodiments of FIGS. 1–5, the integrated light quantity is measured during the exposure process by using the beam splitter 5 and the detector 10, and the exposure amount control to the photosensitive substrate W is made on the basis of the measurement, the exposure amount control may be made by irradiating the photosensitive substrate with a determined number of light pulses from the excimer laser 1.

Further, in the embodiments of FIGS. 1–5, the transmissivity of the optical system is maintained constant. This is because the photosensitive substrate can be exposed with a correct exposure amount, provided that at least the transmissivity of the optical system 7 and 8 is substantially constant. The structure may of course be arranged so that the transmissivity of a system comprising the illumination optical system 14 and the projection optical system 8 is controlled and maintained substantially constant. Practically, on that occasion, the characteristic of a transmissivity change of such a system as a whole is similar to that shown in FIG. 2 or 3. Thus, in the embodiments of FIGS. 1–5, the transmissivity of the system comprising the illumination optical system 14 and the projection optical system 8 is maintained substantially constant.

Next, an embodiment of a device manufacturing method which uses an exposure apparatus such as described above, will be explained.

Figure 6:
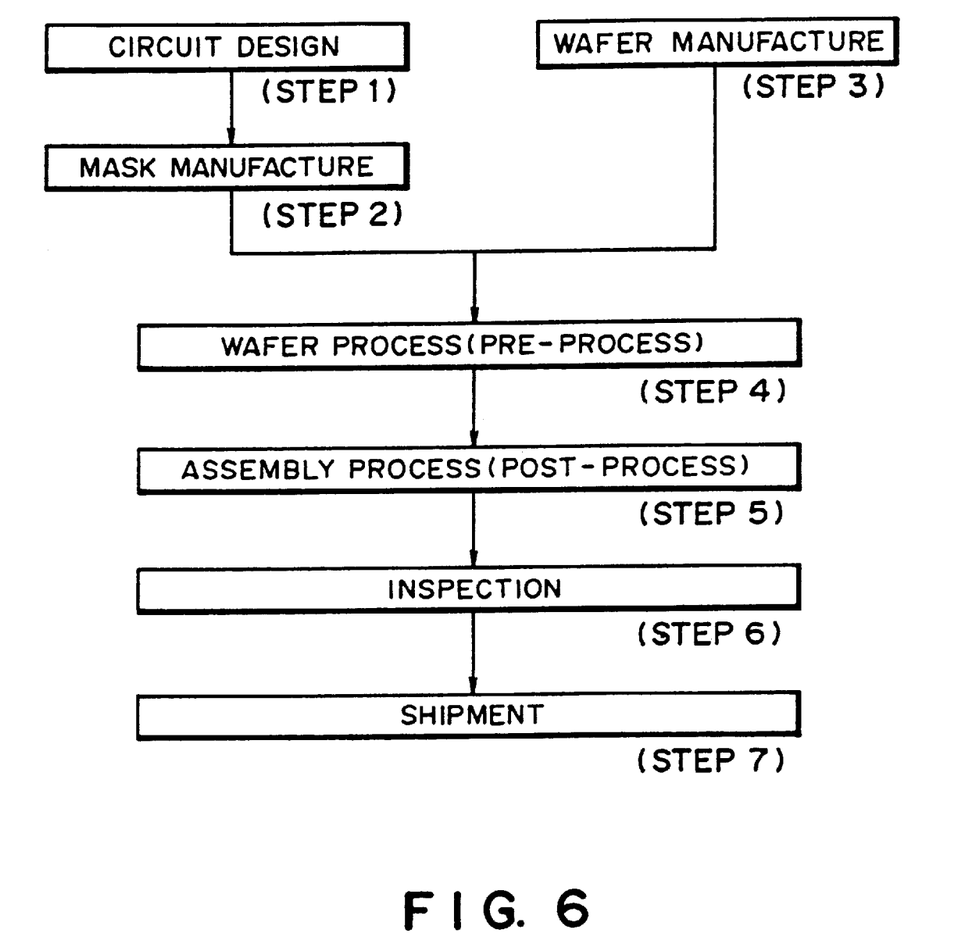
FIG. 6 is a flow chart of semiconductor device manufacturing processes.

FIG. 6 is a flow chart of a procedure for the manufacture of microdevices such as semiconductor chips (e.g., ICs or LSIs), liquid crystal panels or CCDS, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 7:
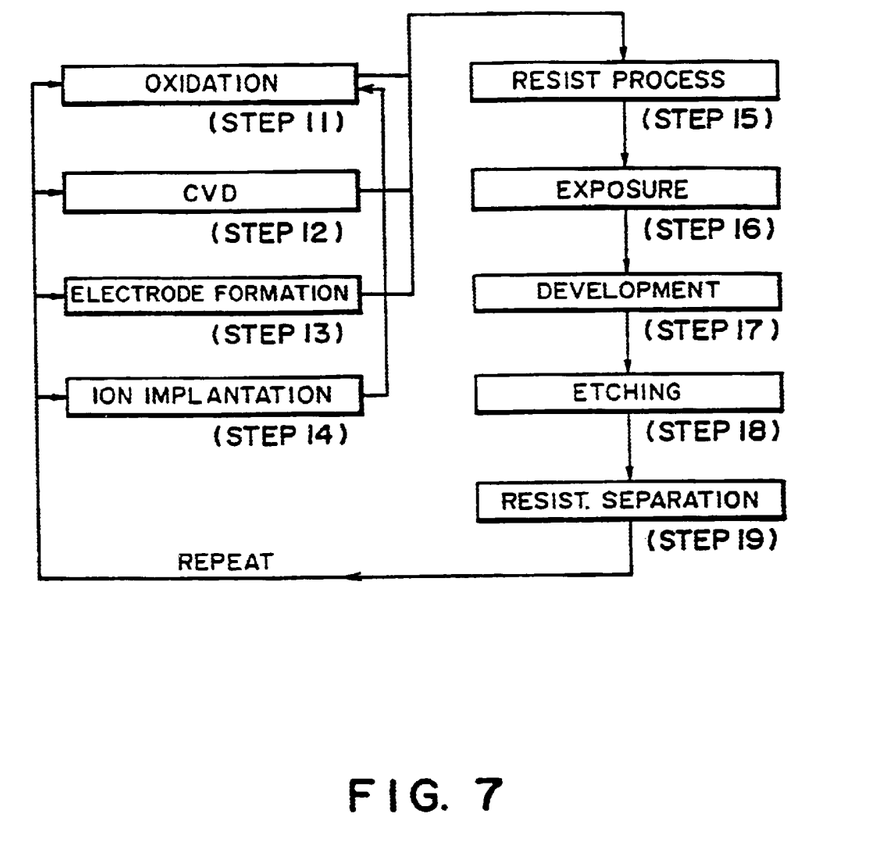
FIG. 7 is a flow chart for explaining a wafer process in the procedure of FIG. 6.

FIG. 7 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, the transmissivity of an illumination optical system or a projection optical system can be maintained substantially constant, during the exposure process of a photosensitive substrate. Thus, a photosensitive substrate such as a wafer can be exposed with a correct exposure amount. This is particularly effective for an exposure apparatus or a device manufacturing method which uses, as a light source, an ultraviolet laser such as a KrF excimer laser or an ArF excimer laser which emits a large intensity pulse light. Also, there is an additional advantage that the non-uniformness of illuminance on the surface to be exposed can be made small.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for transferring a pattern onto a substrate by exposure, said apparatus comprising:

first determining means for determining a light quantity on the substrate on the basis of an extracted portion of an exposure light from a light source;

means for irradiating a projection optical system that directs the pattern by exposure onto the substrate with exposure light from an optical system providing the extracted portion of the exposure light; and transmission factor stabilizing means, responsive to a light quantity determined by the first determining means, for irradiating during a period in which an exposure process is not performed the projection optical system with exposure light to stabilize a transmission factor of the projection optical system during a subsequent exposure process.

2. An apparatus according to claim 1, wherein said transmission factor stabilizing means functions to stop the irradiation of the exposure light to the projection optical system on the basis of a determination by said first determining means.

3. An apparatus according to claim 2, wherein said transmission factor stabilizing means functions to irradiate the exposure light to the projection optical system on the basis of predetermined information.

4. An apparatus according to claim 3, wherein the exposure light comprises pulse light and the predetermined information includes a number of pulses of light irradiated.

5. An apparatus according to claim 3, wherein the predetermined information includes light irradiation time.

6. An apparatus according to claim 1, further comprising second determining means for determining a light quantity at a position corresponding to the substrate, wherein said transmission factor stabilizing means irradiates the exposure light to the projection optical system on the basis of determinations by said first determining means and said second determining means.

7. A device manufacturing method comprising:

an actual exposure step of transferring, by exposure, a pattern onto a substrate while determining by determining means a light quantity on the substrate on the basis of an extracted portion of exposure light from a light source;

a developing step of developing the substrate having the pattern transferred thereto;

an irradiating step of irradiating a projection optical system that directs the pattern by exposure onto the substrate with exposure light from an optical system providing the extracted portion of the exposure light; and a transmission factor stabilizing step of irradiating the projection optical system with exposure light in a period in which an exposure process is not performed responsive to a light quantity determined by the determining means to stabilize a transmission factor of the optical element during a subsequent exposure process.

8. An exposure apparatus for exposing a substrate to a pattern of a mask, said apparatus comprising:

an illumination optical system for illuminating the mask with exposure light from a light source;

a projection optical system for projecting the pattern of the mask onto the substrate;

transmission factor stabilizing means for irradiating, during a period in which an exposure process is not performed, said projection optical system with a predetermined amount of exposure light so as to stabilize a transmission factor of said projection optical system during an exposure process, wherein the transmission factor of said projection optical system is gradually changeable in response to irradiation of said projection optical system with light until it is saturated, and wherein said predetermined amount is determined on the basis of the quantity of irradiation necessary for the saturation.

9. An apparatus according to claim 8, wherein said predetermined amount is determined on the basis of a number of pulses.

10. An apparatus according to claim 8, wherein said predetermined amount is determined on the basis of time.

11. An apparatus according to claim 8, wherein said illumination optical system includes an optical element for extracting a portion of the exposure light from the light source, and a detector for detecting the extracted portion of the exposure light.

12. An apparatus according to claim 8, wherein said optical element is a beam splitter.

13. An apparatus according to claim 12, wherein said illumination optical system further includes a lens system for illuminating the pattern with another exposure light defined by said beam splitter, and wherein said transmission factor stabilizing means is arranged to irradiate, during a period in which the exposure process is not performed, said projection optical system and said lens system with exposure light, whereby the transmission factors of said projection optical system and of the lens system are stabilized.

14. An apparatus according to claim 8, wherein said transmission factor stabilizing means includes a controller for controlling the light source.

15. An apparatus according to claim 8, further comprising a shutter, wherein said transmission factor stabilizing means includes a controller for controlling said shutter.

16. An apparatus according to claim 8, further comprising a light source, as the light source aforesaid.

17. An apparatus according to claim 8, wherein the light source is a laser.

18. An apparatus according to claim 8, wherein the light source is a lamp.

19. A device manufacturing method, comprising the steps of:

exposing a substrate by use of an exposure apparatus as recited in claim 8, and developing the exposed substrate.

20. An apparatus according to claim 8, wherein said transmission factor stabilizing means irradiates said projection optical system with a number of exposure pulses corresponding to the predetermined amount of exposure light.

21. An apparatus according to claim 8, wherein said transmission factor stabilizing means irradiates said projection optical system during a period corresponding to the predetermined amount of exposure light.

* * * * *

UNITED STATES PATENT AND TRADEMARK OFFICE
CERTIFICATE OF CORRECTION

PATENT NO. : 6,621,558 B1
DATED : September 16, 2003
INVENTOR(S) : Kazuhiro Takahashi It is certified that error appears in the above-identified patent and that said Letters Patent is hereby corrected as shown below:

Title Page,
Item [56], References Cited, FOREIGN PATENT DOCUMENTS, the last document listed "JP    6-77107    3/1997" should read -- JP    9-77107    3/1997 --.

Column 1,
Line 50, "attribute" should read -- be attributed to --.
Line 51, "from" should be deleted.

Column 12,
Line 6, "substrate;" should read -- substrate; and --.
Line 53, "8, and" should read -- 8; and --.

Signed and Sealed this

Tenth Day of February, 2004

JON W. DUDAS
*Acting Director of the United States Patent and Trademark Office*